(12) United States Patent
Yang et al.

(10) Patent No.: US 9,000,849 B2
(45) Date of Patent: Apr. 7, 2015

(54) CONTINUOUS PHASE ADJUSTMENT BASED ON INJECTION LOCKING

(71) Applicant: Oracle International Corporation, Redwood City, CA (US)

(72) Inventors: Suwen Yang, Mountain View, CA (US); Frankie Y. Liu, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 39 days.

(21) Appl. No.: 14/011,136

(22) Filed: Aug. 27, 2013

(65) Prior Publication Data

US 2014/0312982 A1    Oct. 23, 2014

Related U.S. Application Data

(60) Provisional application No. 61/813,313, filed on Apr. 18, 2013.

(51) Int. Cl.
H03L 7/24 (2006.01)
(52) U.S. Cl.
CPC .................................. H03L 7/24 (2013.01)

(58) Field of Classification Search
CPC ........................................................ H03L 7/24
USPC ........................................ 331/55, 46, 47, 2, 49
See application file for complete search history.

(56) References Cited

U.S. PATENT DOCUMENTS 7,952,438 B2 * 5/2011 Song et al. ....................... 331/51
8,570,108 B2 * 10/2013 Ragunathan et al. ........... 331/47

\* cited by examiner

*Primary Examiner* — Arnold Kinkead
(74) *Attorney, Agent, or Firm* — Park, Vaughan, Fleming & Dowler LLP; Steven E. Stupp

(57) ABSTRACT

A phase-modification circuit is described. This phase-modification circuit reduces jitter by injecting a divided reference clock in a phase-locked loop from an auxiliary oscillator and by effectively gradually and completely transferring its phase to a master oscillator. The phase-correction strength in the phase-modification circuit is increased by successively coupling an edge in the divided reference clock over many cycles of a clock in the master oscillator. By increasing the correction strength, the phase error is effectively nulled out, thereby reducing the total absolute peak jitter. Moreover, because the correction is gradual and successive, the phase-modification circuit also significantly reduces the cycle-to-cycle jitter and half-cycle or edge jitter.

20 Claims, 8 Drawing Sheets

CONTINUOUS PHASE ADJUSTMENT BASED ON INJECTION LOCKING

CROSS REFERENCE TO RELATED APPLICATION

This application claims priority under 35 U.S.C. §119(e) to U.S. Provisional Application Ser. No. 61/813,313, entitled "Phase Adjustment and Jitter Attenuation in Phase-Locked Loop Oscillator," by Frankie Y. Liu and Suwen Yang, filed on Apr. 18, 2013, the contents of which are herein incorporated by reference.

BACKGROUND

1. Field

The present disclosure generally relates to the design of circuits typically employed by timing elements in modern computer systems. More specifically, the present disclosure relates to the design of a continuous phase-modification circuit based on an injection-locking mechanism to reduce phase variation in ring oscillators.

2. Related Art

As the distance between computing/memory nodes continues to increase, long-distance off-chip and on-chip communication is becoming a more-prevalent concern for system designers. At the same time, in order to improve system performance, data rates are increasing. A common technology underlying this long-distance/fast data-rate communication facilitates the retiming of data via amplifying latches to restore signal integrity (e.g., such as in a transmitter and receiver setting, where the phases of the transmitting and receiving ends are arbitrary).

Retiming of synchronous data usually involves some form of phase adjustment of a local clock to synchronize it with the incoming data stream. During this process, the local clock is adjusted to sample at the middle (or within a time window) of the data eye (e.g., the edge from a DLL must be within 5 ps of the ideal sampling point). Clock phase alignment is usually accomplished by using a phase-locked loop (PLL) or a delay-locked loop (DLL). Because faster data rates imply an ever-shrinking data eye, there is a corresponding tighter demand on the position of the sampling edges generated from PLLs and DLLs. Moreover, because noise inherent in systems tends to widen the phase window of PLLs and DLLs, this means that the distribution of edges around the ideal sampling point becomes wider, which makes it harder to meet the constraints of an edge falling in a certain time window. Therefore, lowering the output clock jitter from PLLs and DLLs is of paramount importance.

FIG. 1 presents a block diagram illustrating an existing PLL, which generates a clock signal via an oscillator. This PLL adjusts the phase and frequency so that, when locked, both the frequency and the phase of the multiplied clock from the voltage-controlled oscillator (VCO) are in sync with the reference input to the PLL. In particular, the feedback control is split into a frequency-control path and a phase-control path. The frequency-control path detects a frequency error and integrates this error to drive it to zero. Alternatively, the phase-control path provides a linear proportional correction to the phase. The feedback-control loop compares a divided clock in an oscillator to a reference clock. When the edges of the divided clock and reference clock do not match, the control loop speeds up or advances the phase and slows down or retards the phase accordingly to allow the oscillator edge to synchronize with the reference edge. Typically the reference frequency is many times smaller than the oscillator frequency.

Moreover, in order to maintain feedback-loop stability, the frequency of the control loop is many times smaller than the reference frequency. This implies that it takes a long time for the accumulated phase error to be corrected, a time on the order of several loop time constants. By adjusting the phase correction strength, the amount of phase adjustment in one reference clock cycle can be increased at the cost of incurring a larger dither during stable operation.

Hence, what is needed is a phase-modification circuit without the above-described problems.

SUMMARY

One embodiment of the present disclosure provides a phase-modification circuit that includes a master oscillator that continuously oscillates to provide an output clock. Moreover, an auxiliary oscillator in the phase-modification circuit selectively oscillates to provide an auxiliary signal, where the auxiliary oscillator is gated by a divided reference clock (which may be a divided version of a reference clock), and the auxiliary signal is in-phase with the divided reference clock. Furthermore, the phase-modification circuit includes an injection-locking mechanism that selectively couples the auxiliary signal to the master oscillator to continuously correct a phase error of the output clock relative to the divided reference clock so that the phase error is corrected within a half period of the divided reference clock.

In some embodiments, the injection-locking mechanism includes an enabled inverter to selectively couple the auxiliary signal to the master oscillator. This enabled inverter may be gated by a select signal corresponding to the divided reference clock. Moreover, the select signal may have a different duty cycle than the divided reference clock and/or a different phase than the divided reference clock. Additionally, the phase-modification circuit may include control logic that specifies the different duty cycle and/or the different phase.

Furthermore, the phase-modification circuit may include a second auxiliary oscillator that selectively oscillates to provide a second auxiliary signal, where the second auxiliary oscillator is gated by a logical inverse of the divided reference clock, and the second auxiliary signal is in-phase with the logical inverse of the divided reference clock. Note that the injection-locking mechanism may selectively couple the second auxiliary signal to the master oscillator to continuously correct the phase error of the master oscillator relative to the divided reference clock so that the phase error is corrected within a half period of the divided reference clock. In some embodiments, the injection-locking mechanism includes enabled inverters to selectively couple the auxiliary signal and the second auxiliary signal to the master oscillator. These enabled inverters may be gated by select signals corresponding to the divided reference clock. Moreover, the select signals may have a different duty cycle than the divided reference clock and/or a different phase than the divided reference clock. Additionally, the phase-modification circuit may include control logic that specifies the different duty cycle and/or the different phase.

Note that the phase error may be corrected within a few periods of the output clock. More generally, the phase error may be corrected within an adjustable number of periods.

Another embodiment provides an electronic device that includes the phase-modification circuit.

Another embodiment provides a method for correcting the phase error of the output clock relative to the divided reference clock. During the method, the output clock is provided using the continuously oscillating master oscillator. Then, the auxiliary signal is provided using the selectively oscillating auxiliary oscillator, where the auxiliary oscillator is gated by the divided reference clock, the auxiliary signal is in-phase with the divided reference clock, and the divided reference clock is a divided version of a reference clock. Next, using the injection-locking mechanism, the auxiliary signal is selectively coupled to the master oscillator to continuously correct the phase error of the output clock relative to the divided reference clock so that the phase error is corrected within a half period of the divided reference clock.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a phase-modification circuit, an electronic device that includes the phase-modification circuit, and a method for correcting a phase error of an output clock relative to a divided reference clock in a phase-locked loop are described. The phase-modification circuit reduces jitter by injecting a divided reference clock from an auxiliary oscillator and by effectively gradually and completely transferring its phase to a master oscillator. The phase-correction strength in the phase-modification circuit is increased by successively coupling an edge in the divided reference clock over many cycles of a clock in the master oscillator. By increasing the correction strength, the phase error is effectively nulled out, thereby reducing the total absolute peak jitter. Moreover, because the correction is gradual and successive, the phase-modification circuit also significantly reduces the cycle-to-cycle jitter and half-cycle or edge jitter.

By reducing jitter, the phase-modification circuit facilitates phase-alignment blocks, such as phase-locked loops (PLLs), with improved performance. The phase-modification circuit can enable high-speed links with increased data rates for use in intra-chip and inter-chip communication. In addition, the high-energy efficiency of the phase-modification circuit may allow the number of available channels in a high-speed link to be scaled.

We now describe embodiments of the phase-modification circuit. In the discussion that follows, the term 'phase alignment' is broadly used to encompass the repositioning of edges in one signal with respect to edges in another 'reference' signal. A phase-alignment element is described and its operation is exemplified in context. A recurring theme in this discussion is the use of phase alignment via temporal and spatial mixing/multiplexing. Both of these forms of mixing are described as performing 'distributed' phase correction, and the phase-alignment element is used either to enhance or add additional functionality to a timing block, such as a PLL. In particular, in the context of a phase-error detector and correction block for a PLL, the distributed coupling adds a design dimension in terms of trading off phase-correction gain versus cycle jitter.

Figure 1:
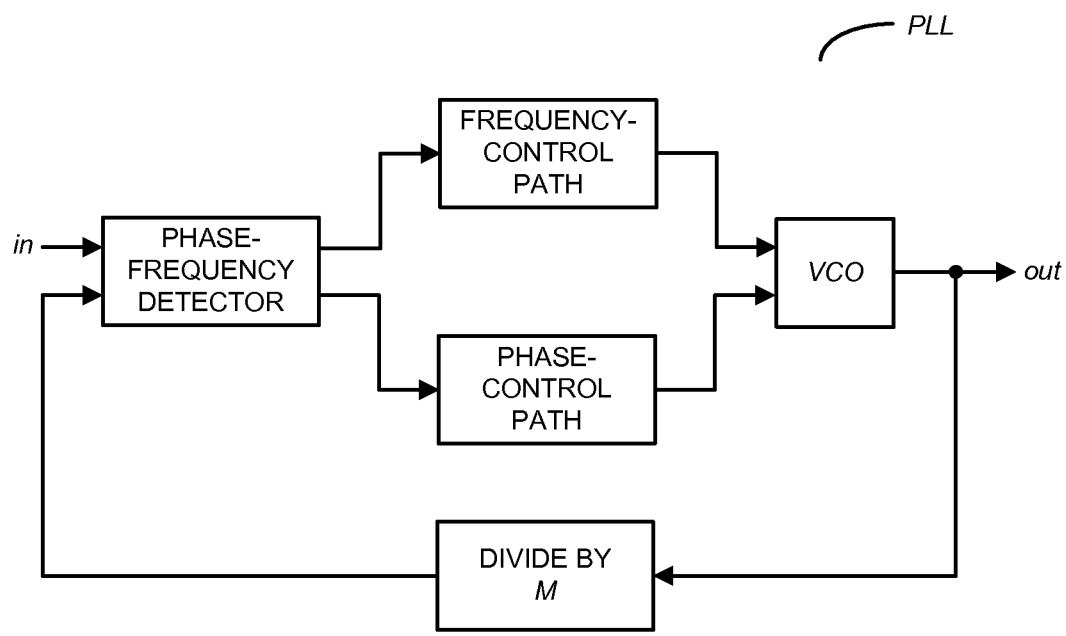
FIG. 1 is a block diagram illustrating an existing phase-locked loop (PLL).
Figure 2:
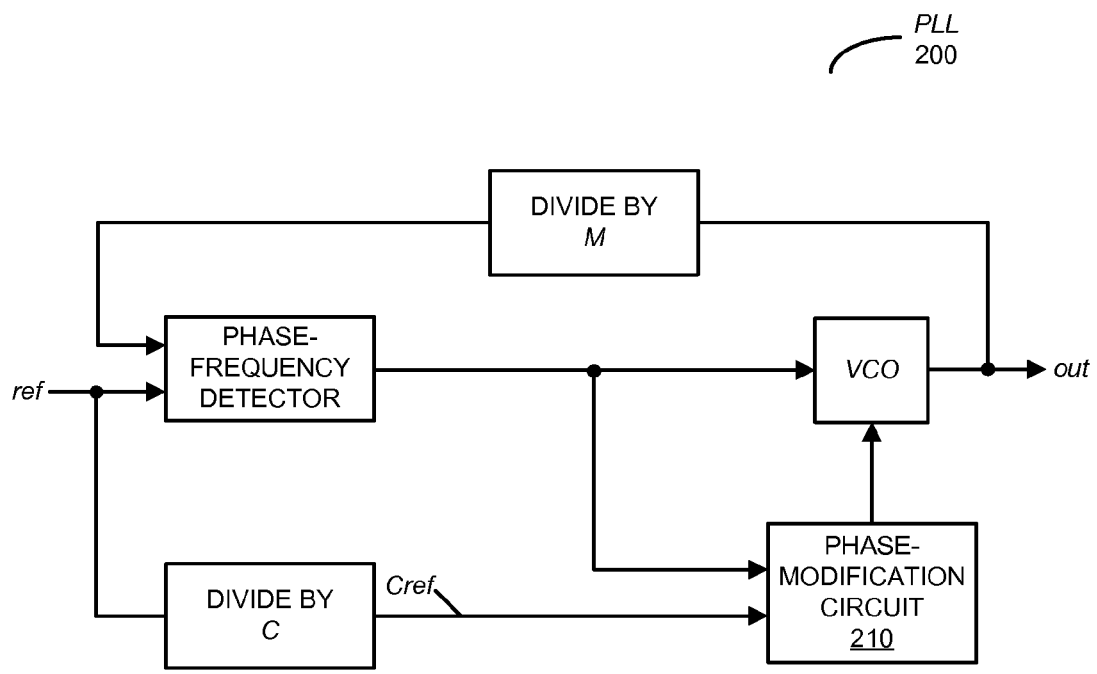
FIG. 2 is a block diagram illustrating a PLL in accordance with an embodiment of the present disclosure.

FIG. 2 presents a block diagram illustrating a PLL 200 that includes a phase-modification circuit 210. In contrast with the existing PLL of FIG. 1, phase-modification circuit 210 in PLL 200 (which includes the phase-alignment element) uses the edges in the divided reference clock (Cref) and the output from the phase-frequency detector to injection lock the phase of a master oscillator (the VCO) with one or more auxiliary oscillators in phase-modification circuit 210 to reduce jitter (as described further below with reference to FIG. 5). In particular, PLL 200 has a global reference clock (ref), which is typically a slow clock that is eventually multiplied up to the PLL frequency (e.g., a 1 MHz reference clock) in the output (out) PLL clock. The frequency of the output is M times the frequency of the global reference clock (so for M equal to 10, the output is at 10 MHz). Note that M is shown as the divider ratio in FIGS. 1 and 2.

Figure 4:
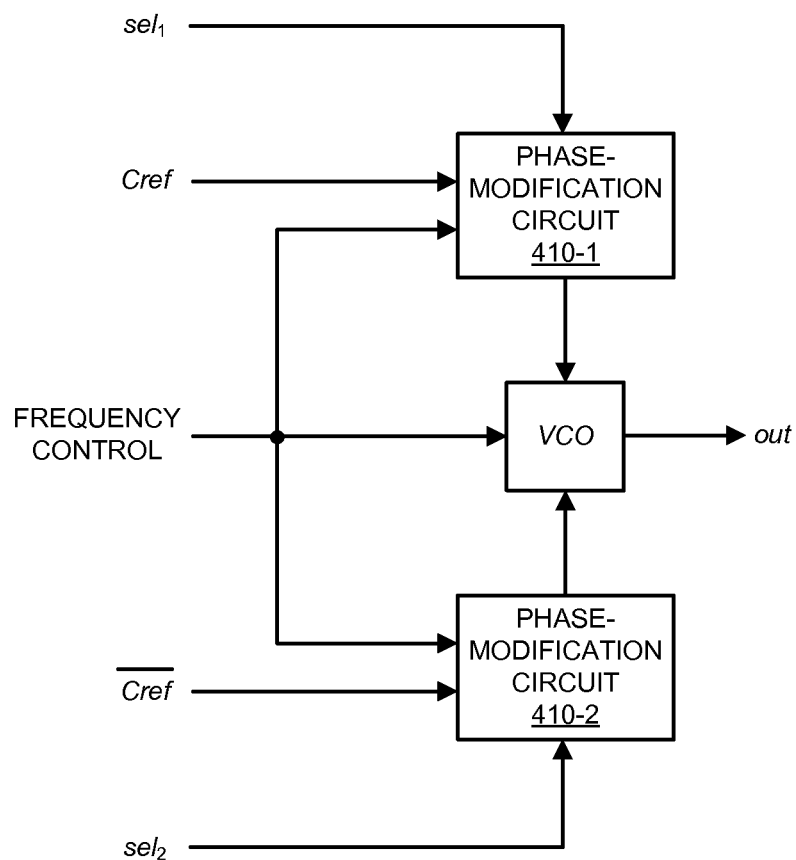
FIG. 4 is a block diagram illustrating phase-modification circuits in accordance with an embodiment of the present disclosure.

The reference clock is divided by C to produce a divided reference clock (Cref). This divided reference clock is used to gate the one or more auxiliary oscillators in phase-modification circuit 210. The divided reference clock is typically a subharmonic of the reference clock, for example, it can be at ½ MHz, ⅓ MHz, ¼ MHz, etc. As shown in FIG. 4, there may also be the logical inverse of the divided reference clock, which is at the same frequency as the reference clock.

Figure 3:
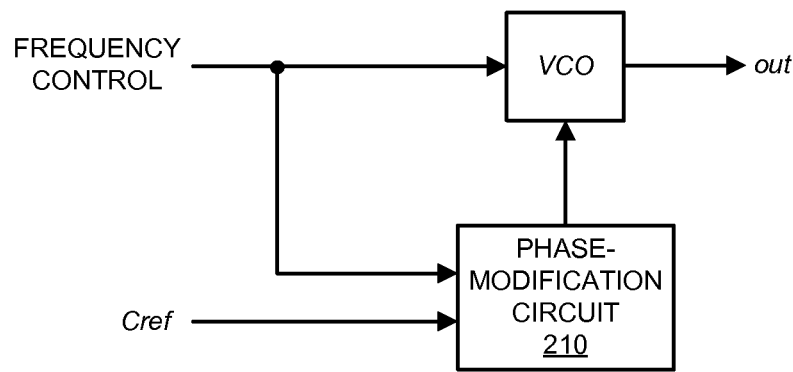
FIG. 3 is a block diagram illustrating a phase-modification circuit in accordance with an embodiment of the present disclosure.

FIG. 3 highlights the attachments to the phase-modification circuit 210. Furthermore, as shown in FIG. 4, which presents a block diagram illustrating phase-modification circuits 410, the phase-modification circuit may be split into two separate paths (each with an auxiliary oscillator) that operate on different phases of the divided reference clock. This configuration may allow separate and selective injection locking to the auxiliary oscillators in phase-modification circuits 410 using divided reference clocks ($C_{ref}$, $\overline{C_{ref}}$) and select signals ($sel_1$, $sel_2$). More generally, there may be more than two auxiliary oscillators.

As described further below, what distinguishes the divided reference clock (and/or its logical inverse) from the other signals in the PLLs is the fact that the rising and falling edges of divided reference clock are aligned to the rising edges of the reference clock. This feature allows the gating of the auxiliary oscillator(s) by the divided reference clock(s) to be synchronized to the rising edges of the reference clock, because the divided reference clock is a subharmonic of the reference clock.

Figure 5:
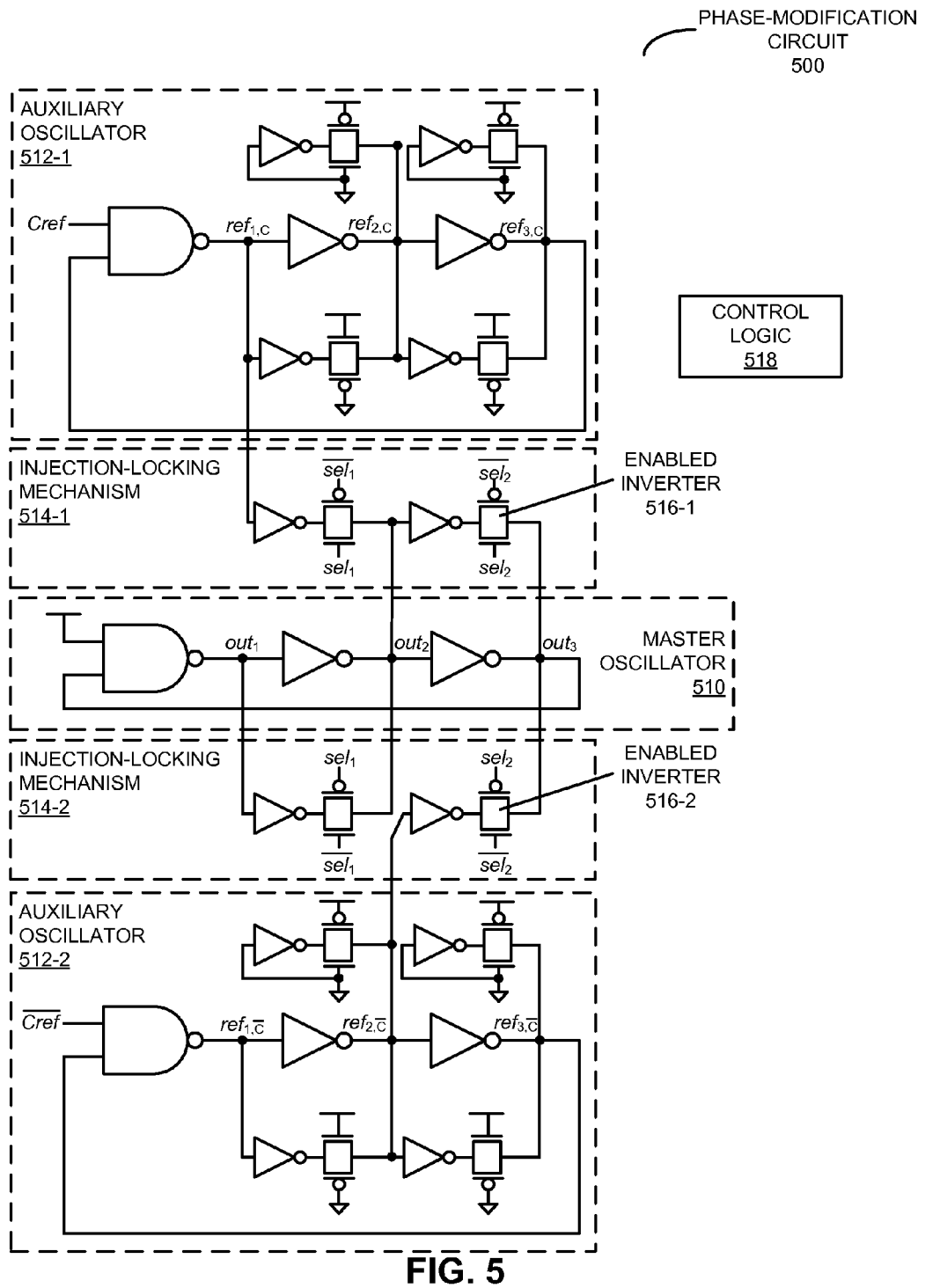
FIG. 5 is a block diagram illustrating a phase-modification circuit in accordance with an embodiment of the present disclosure.

FIG. 5 presents a block diagram illustrating a phase-modification circuit 500. This phase-modification circuit includes a master oscillator 510 that continuously oscillates to provide an output clock ($out_3$). Moreover, an auxiliary oscillator 512-1 selectively oscillates to provide an auxiliary signal ($ref_{1,c}$), where auxiliary oscillator 512-1 is gated by a divided reference clock ($C_{ref}$), and the auxiliary signal is in-phase with the divided reference clock. Furthermore, an injection-locking mechanism 514-1 selectively couples the auxiliary signal to master oscillator 510 (i.e., injection locks or passes over the phase of auxiliary oscillator 512-1 into master oscillator 510) to continuously correct (i.e., using multiple distributed adjustments) a phase error of the output clock relative to the divided reference clock so that the phase error is corrected within a half period of the divided reference clock and/or within a few periods of the output clock (more generally, the phase error may be corrected within an adjustable number of periods). In particular, the divided reference clock initiates oscillations in auxiliary oscillator 512-1, and this initial condition sets the phase of auxiliary oscillator 512-1. The phase of master oscillator 510 is then mixed with that of auxiliary oscillator 512-1 so that an edge in auxiliary oscillator 512-1 advances or retards an edge in master oscillator 510 according to their relative phase difference.

In some embodiments, injection-locking mechanism 514-1 includes one or more enabled inverters (such as enabled inverter 516-1) to selectively couple the auxiliary signal to master oscillator 510. This enabled inverter may be gated by a select signal (such as $sel_1$, $\overline{sel_1}$, $sel_2$, or $\overline{sel_2}$) corresponding to the divided reference clock. Moreover, the select signal may have a different duty cycle than the divided reference clock and/or a different phase than the divided reference clock. Additionally, phase-modification circuit 500 may include control logic 518 that specifies the different duty cycle and/or the different phase.

Furthermore, phase-modification circuit 500 may include an auxiliary oscillator 512-2 that selectively oscillates to provide a second auxiliary signal ($ref_{2,\overline{c}}$), where auxiliary oscillator 512-2 is gated by a logical inverse of the divided reference clock, and the second auxiliary signal is in-phase with the logical inverse of the divided reference clock. Note that injection-locking mechanism 514-2 may selectively couple the second auxiliary signal to master oscillator 510 to continuously correct the phase error of master oscillator 510 relative to the divided reference clock so that the phase error is corrected within a half period of the divided reference clock. In some embodiments, injection-locking mechanism 514-2 includes one or more enabled inverters (such as enabled inverter 516-2) to selectively couple the auxiliary signal and the second auxiliary signal to master oscillator 510. These enabled inverters may be gated by select signals corresponding to the divided reference clock. Moreover, the select signals may have a different duty cycle than the divided reference clock and/or a different phase than the divided reference clock. Additionally, control logic 518 may specify the different duty cycle and/or the different phase of these select signals.

In the PLL shown in FIG. 1, once the frequency of the oscillator is locked to the desired frequency, the phase-control path adjusts the phase of the oscillator to align its phase with that of the divided reference clock. The phase of the voltage-controlled oscillator (VCO) can be adjusted by varying the load or drive strength in the oscillator path. In one existing implementation of a PLL, charge is injected into the VCO in a short-time window to enhance the edge rate at a particular node in the oscillator loop, with the width of the aperture window made proportional to the phase difference. However, the available phase gain may be sensitive to the alignment of the aperture window with respect to the edges in the VCO. For example, if charge is injected at a node when its voltage is changing, the phase gain is maximized. But if charge is injected when the node is already at the voltage rails, the phase gain is close to nil. In order to reduce this sensitivity, the aperture window in this existing implementation of a PLL is replicated over multiple aperture points spanning an oscillator cycle. This is analogous to shooting a moving target with a shotgun that scatters a number of pellets to cover a large area. It is conceivable to better align the aperture window with node transitions, but with an additional cost of a separate control loop.

In contrast, in the present disclosure a VCO (the master oscillator 510) takes advantage of well-controlled stage delays to identify natural coupling points. In particular, in FIG. 5 edges from replicas of the VCO (i.e., auxiliary oscillators 512) are used to align the edges in the main VCO (i.e., master oscillator 510). Thus, in the phase-control path shown in FIG. 5, the center loop is the primary oscillator loop, and the two outer loops are replicas of the center loop. Because all three loops share a mutual power supply, their operating frequencies are nominally matched. In contrast with the primary loop, the oscillations in the replica loops are not continuous, but gated by the divided reference clock: the upper by the hi phase of the divided reference clock and the lower by the opposite phase. As both replica loops operate back-to-back, their overall power draw is roughly equalized over a reference cycle, to minimize power-supply variation.

The running phases of the replica loops are synchronized to the divided reference clock edge via the gating action. In addition, the edges in the replica loops have well-defined spacing, because all loops are nominally frequency locked. Consequently, these edges serve as potential candidates for control-signal inputs ctrl to phase-alignment elements in the second and third stages of the primary loop. These phase-alignment elements resemble a surfing inverter-based phase-alignment element. In the PLL context, the driving strength along the ctrl path may be chosen to be much weaker than the one on the in path. Consequently, the ctrl signal from the replica loops is able to directly couple into the in path without compromising oscillator operation. Even though the coupling of a single edge through the phase-alignment elements is made much weaker, through the combined coupling of multiple edges, the phase-alignment elements can provide enough phase correction over one divided reference clock cycle.

A salient feature of this design is the gradual correction of the phase in the main loop. In one extreme, a reference edge is directly injected into the oscillator loop. This corrects for any phase errors that may have accumulated between correction cycles, but has the detrimental effect of adding a step change in phase, which results in large cycle jitter. By changing the phase in a more gradual manner, as in the described phase-modification circuit, cycle jitter is minimized at the cost of increased absolute jitter. Depending on the application, the former may be preferred for maintaining timing margins when used as a local clock for sequential logic, while the latter may be preferred in a link scenario, where the jitter between the transmitter and receiver clocks is uncorrelated, and therefore more susceptible to absolute jitter. The gradual nature of the phase correction is a consequence of weakly driving the summing nodes through the coupling path. This has the added benefit of introducing less parasitic load as compared with existing PLL designs. This may allow the oscillator to run at a much higher frequency.

As shown in FIG. 5, another knob at our disposal is the control of the coupling time via sel. The coupling time per reference cycle is maximized at half a reference period. Because the replica loop is itself a free-running oscillator, it also accumulates phase error over time. At the start of the gated oscillation, the phase in the replica loop is well aligned with the divided reference clock edge, and then, over time, its phase loses this fidelity through the accumulation of phase noise. Therefore, it may be advantageous to limit the amount of coupling to a time in close proximity with the divided reference clock edge. However, in order to maintain the same overall phase gain, the coupling strength has to be increased. But, as noted previously, strong coupling in a short aperture window leads to a large cycle jitter penalty. By spreading the correction over several cycles, the correction can be made more gradual. However, if the correction is made over too long a time interval, the secondary loop itself becomes out of sync with the reference edge. This suggests a balance in the choice of coupling strength and coupling time, to jointly minimize both absolute and cycle jitter. For example, 1-α may be 0.5 or 0.79, and the number of coupling edges may be between 3 and 10.

Figure 6:
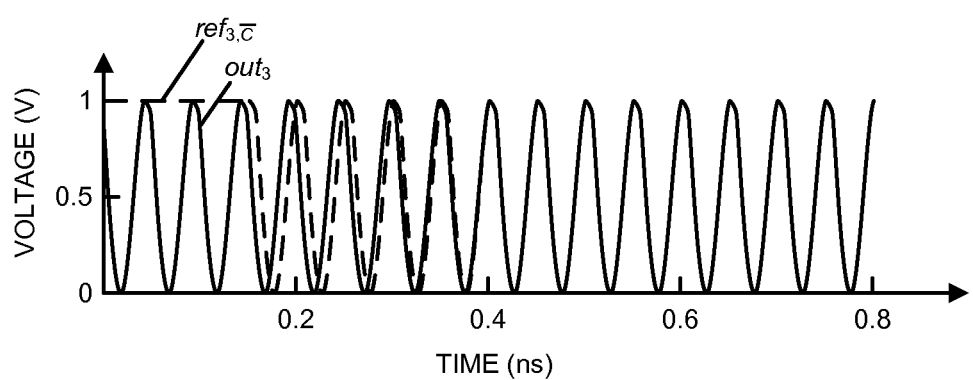
FIG. 6 is a timing diagram illustrating operation of the phase-modification circuit of FIG. 5 in accordance with an embodiment of the present disclosure.

Operation of the phase-modification circuit is shown in FIG. 6. Prior to the time window shown in FIG. 6, the phase in the primary loop may have been 'locked' with that of the divided reference clock, so that the primary loop starts with a stable state in sync with the reference. Then, a relative phase error is introduced by advancing the divided reference clock edge to a later time with respect to the primary loop. This effectively introduces a step phase error. While the same result can be accomplished by introducing a step in phase at the primary loop, more state information must be changed in the latter case, as compared to simply advancing/retarding the reference phase. For the purpose of illustration, the sel pulse is pushed to a later time in order to show a visible offset between the phases of the secondary and primary loops (a time window of 0.15-0.32 ns in FIG. 6). At the onset of sel, the phase of the primary loop may be observed to be 'catching up,' or rather slowing down, with respect to the phase of the secondary loop. By the tail end of the sel signal, most of the phase difference is effectively removed.

In an exemplary embodiment of a PLL, the phase-alignment element is applied along the phase control path. A gated replica loop is used to transfer phase information from the divided reference clock to the primary oscillator loop. Through multiple coupling events from the replica to the primary loop, the phase errors in the latter are gradually corrected, thereby reducing the overall peak-to-peak cycle jitter. For an equivalent correction factor, this phase-modification technique presents a much smaller load to the oscillator as compared to the approaches used in existing PLLs. The load is determined by the required correction strength necessary to achieve a particular overall gain. In the disclosed phase-modification technique, because the correction is distributed in time through multiple coupling events, the individual coupling between loops can be relatively weak. By adjusting the coupling strength and the width of the sel signal, the phase control path can easily achieve a gain close to unity, i.e., in a half divided reference clock cycle, the phase control path is capable of removing all the accumulated phase error. In the phase-modification technique, the total gain grows exponentially with the number of coupling events, e.g., for ten coupling edges, a coupling strength of 0.2 may be sufficient for near unity gain. The load presented by this coupling may introduce a 20% load overhead to the primary oscillator. Because energy consumption in a PLL is dominated by the total load being driven at high frequencies, the disclosed VCO (i.e., the master oscillator) and phase control path is capable of achieving a high energy efficiency.

In contrast with existing PLLs, the coupling of the reference phase via the phase-modification circuit may replace the need for a phase detector, because the detection and adjustment are done by the same block. Moreover, the phase-correction strength via the phase-modification circuit may be close to one, i.e., it effectively removes all phase error within a reference cycle. The coupling inherent in the design may reduce not only the peak jitter, but also the cycle-to-cycle jitter because the adjustment is gradual. Furthermore, the mixing from the two oscillating loops, the primary and slave loops, may average the rms jitter from both loops, thereby reducing the overall rms jitter. Additionally, the energy spent in phase correction may be significantly reduced compared to existing PLLs.

Figure 7:
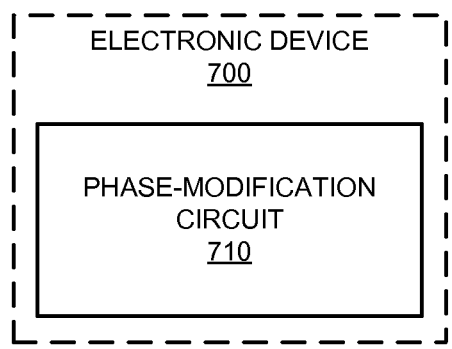
FIG. 7 is a block diagram of an electronic device that includes the phase-modification circuit of FIG. 5 in accordance with an embodiment of the present disclosure.

We now describe embodiments of the electronic device. FIG. 7 presents a block diagram of an electronic device 700 that includes a phase-modification circuit 710, such as phase-modification circuit 500 (FIG. 5).

More generally, embodiments of the phase-modification circuit may be used in a variety of applications, including: VLSI circuits, communication systems, storage area networks, data centers, networks (such as local area networks), memory components (such as those that include a high I/O count), memory systems, and/or computer systems (such as multiple-core processor computer systems, computer systems that include components that communicate via capacitive proximity communication, computer systems that include components that communicate via optical proximity communication, etc.). Note that electronic device 700 may include, but is not limited to: a PLL, a high-speed I/O circuit, an integrated circuit, a server, a laptop computer, a communication device or system, a personal computer, a work station, a mainframe computer, a blade, an enterprise computer, a data center, a tablet computer, a portable-computing device, a supercomputer, a network-attached-storage (NAS) system, a storage-area-network (SAN) system, a cellular telephone, a smartphone, a media player (such as an MP3 player), an appliance, a subnotebook/netbook, a network appliance, a set-top box, a personal digital assistant (PDA), a toy, a controller, a digital signal processor, a game console, a device controller, a computational engine within an appliance, a consumer-electronic device, a portable electronic device, a personal organizer, and/or another electronic device. Moreover, note that a given computer system may be at one location or may be distributed over multiple, geographically dispersed locations.

The preceding embodiments may include fewer components or additional components. Although these embodiments are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 8:
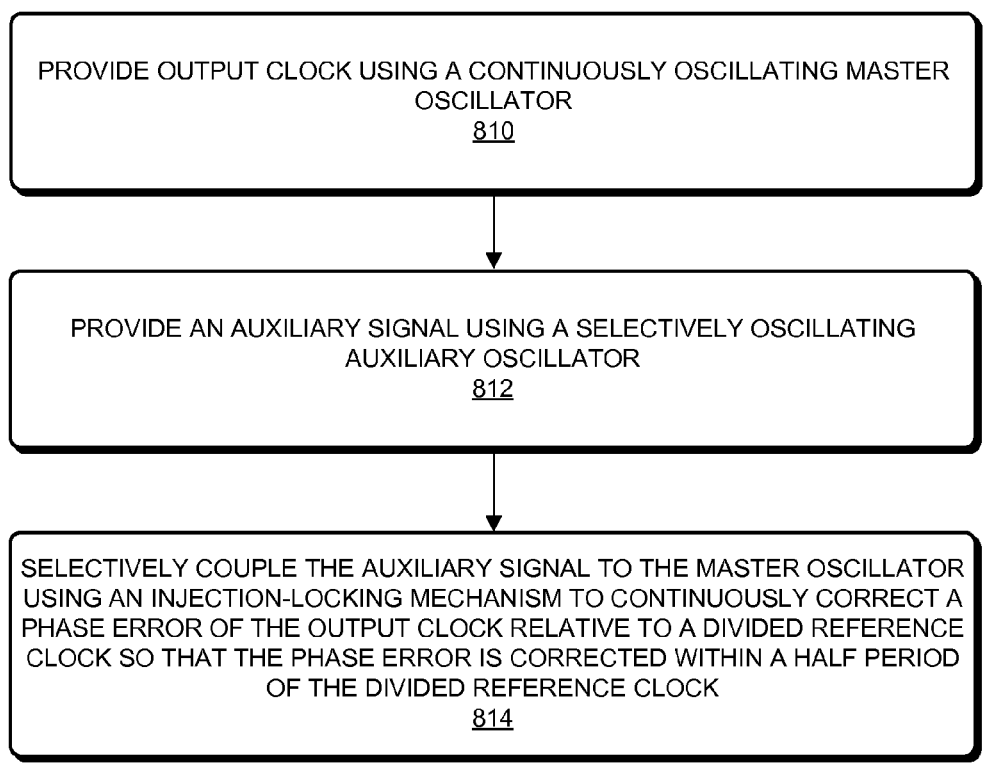
FIG. 8 is a flow chart illustrating a method for correcting a phase error of an output clock relative to a divided reference clock in accordance with an embodiment of the present disclosure.

We now describe embodiments of a method. FIG. 8 presents a flow chart illustrating a method 800 for correcting a phase error of an output clock relative to a divided reference clock in a PLL, which may be performed by a phase-modification circuit (such as phase-modification circuit 500 in FIG. 5). During the method, the output clock is provided using a continuously oscillating master oscillator (operation 810). Then, an auxiliary signal is provided using a selectively oscillating auxiliary oscillator (operation 812), where the auxiliary oscillator is gated by the divided reference clock, the auxiliary signal is in-phase with the divided reference clock, and the divided reference clock is a divided version of a reference clock. Next, using an injection-locking mechanism, the auxiliary signal is selectively coupled to the master oscillator to continuously correct the phase error of the output clock relative to the divided reference clock so that the phase error is corrected within a half period of the divided reference clock (operation 814).

In some embodiments of method 800, there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A phase-modification circuit, comprising:
a master oscillator configured to continuously oscillate to provide an output clock;
an auxiliary oscillator configured to selectively oscillate to provide an auxiliary signal, wherein the auxiliary oscillator is gated by a divided reference clock, wherein the auxiliary signal is in-phase with the divided reference clock, and wherein the divided reference clock is a divided version of a reference clock; and
an injection-locking mechanism configured to selectively couple the auxiliary signal to the master oscillator to continuously correct a phase error of the output clock relative to the divided reference clock so that the phase error is corrected within a half period of the divided reference clock.

2. The phase-modification circuit of claim 1, wherein the injection-locking mechanism includes an enabled inverter to selectively couple the auxiliary signal to the master oscillator.

3. The phase-modification circuit of claim 2, wherein the enabled inverter is gated by a select signal corresponding to the divided reference clock.

4. The phase-modification circuit of claim 3, wherein the select signal has at least one of: a different duty cycle than the divided reference clock and a different phase than the divided reference clock.

5. The phase-modification circuit of claim 4, wherein the phase-modification circuit further includes control logic configured to specify at least one of: the different duty cycle and the different phase.

6. The phase-modification circuit of claim 1, wherein the phase-modification circuit further comprises a second auxiliary oscillator configured to selectively oscillate to provide a second auxiliary signal, wherein the second auxiliary oscillator is gated by a logical inverse of the divided reference clock, and
wherein the second auxiliary signal is in-phase with the logical inverse of the divided reference clock.

7. The phase-modification circuit of claim 6, wherein the injection-locking mechanism is further configured to selectively couple the second auxiliary signal to the master oscillator to continuously correct the phase error of the master oscillator relative to the divided reference clock so that the phase error is corrected within a half period of the divided reference clock.

8. The phase-modification circuit of claim 7, wherein the injection-locking mechanism includes enabled inverters to selectively couple the auxiliary signal and the second auxiliary signal to the master oscillator.

9. The phase-modification circuit of claim 8, wherein the enabled inverters are gated by select signals corresponding to the divided reference clock.

10. The phase-modification circuit of claim 9, wherein the select signals have at least one of: a different duty cycle than the divided reference clock and a different phase than the divided reference clock.

11. The phase-modification circuit of claim 10, wherein the phase-modification circuit further includes control logic configured to specify at least one of: the different duty cycle and the different phase.

12. The phase-modification circuit of claim 1, wherein the phase error is corrected within an adjustable number of periods of the output clock.

13. An electronic device, comprising a phase-modification circuit, wherein the phase-modification circuit includes:
a master oscillator configured to continuously oscillate to provide an output clock;
an auxiliary oscillator configured to selectively oscillate to provide an auxiliary signal, wherein the auxiliary oscillator is gated by a divided reference clock, wherein the auxiliary signal is in-phase with the divided reference clock, and wherein the divided reference clock is a divided version of a reference clock; and
an injection-locking mechanism configured to selectively couple the auxiliary signal to the master oscillator to continuously correct a phase error of the output clock relative to the divided reference clock so that the phase error is corrected within a half period of the divided reference clock.

14. The electronic device of claim 13, wherein the injection-locking mechanism includes an enabled inverter to selectively couple the auxiliary signal to the master oscillator.

15. The electronic device of claim 14, wherein the enabled inverter is gated by a select signal corresponding to the divided reference clock.

16. The electronic device of claim 15, wherein the select signal has at least one of: a different duty cycle than the divided reference clock and a different phase than the divided reference clock.

17. The electronic device of claim 16, wherein the phase-modification circuit further includes control logic configured to specify at least one of: the different duty cycle and the different phase.

18. The electronic device of claim 13, wherein the phase-modification circuit further comprises a second auxiliary oscillator configured to selectively oscillate to provide a second auxiliary signal, wherein the second auxiliary oscillator is gated by a logical inverse of the divided reference clock, and wherein the second auxiliary signal is in-phase with the logical inverse of the divided reference clock.

19. The electronic device of claim 18, wherein the injection-locking mechanism is further configured to selectively couple the second auxiliary signal to the master oscillator to continuously correct the phase error of the master oscillator relative to the divided reference clock so that the phase error is corrected within a half period of the divided reference clock.

20. A method for correcting a phase error of an output clock relative to a divided reference clock, wherein the method comprises:

providing the output clock using a continuously oscillating master oscillator;

providing an auxiliary signal using a selectively oscillating auxiliary oscillator, wherein the auxiliary oscillator is gated by the divided reference clock, wherein the auxiliary signal is in-phase with the divided reference clock, and wherein the divided reference clock is a divided version of a reference clock; and using an injection-locking mechanism, selectively coupling the auxiliary signal to the master oscillator to continuously correct the phase error of the output clock relative to the divided reference clock so that the phase error is corrected within a half period of the divided reference clock.

* * * * *